United States Patent Office 3,472,653

Patented Oct. 14, 1969

3,472,653
NONMIGRATING SOLDERS AND PRINTED CIRCUITS THEREFROM

Oliver A. Short, Wilmington, Del., assignor to E. I. du Pont de Nemours and Company, Wilmington, Del., a corporation of Delaware No Drawing. Filed Mar. 28, 1967, Ser. No. 626,425
Int. Cl. C22c *5/00;* B23p *3/00*
U.S. Cl. 75—165 3 Claims

ABSTRACT OF THE DISCLOSURE

A nonmigrating solder comprising an alloy of gold, tin, and germanium perticularly suitable for use in conjunction with non-migrating conductor compositions in the fabrication of printed circuits of high reliability.

BACKGROUND OF THE INVENTION

Printed circuits mainly comprise a ceramic substrate having printed thereon a metalizing composition (e.g., noble metal, a binder, and a vehicle). Printed circuits generally require soldering to permit the attachment of leads, the mounting of components, or to enhance the conductivity of the printed circuits. Electrical leads or wires are soldered to printed circuits as a means of supplying electricity thereto. It has long been desired to be able to apply to a ceramic glass substrate, metallic coatings which can be soldered in order to provide for attaching of the electrical leads and for applying thereto by brazing or soldering, support members, flanges, structural members and the like in order to prepare various structures in the electronic industry. In the electrical industry there are various articles comprising a glass or ceramic base to which is applied a relatively thin electrical conductive coating, for example, finely divided noble metal coatings, which coatings are subjected to a firing in order to adhere the coatings to the base. The attaching of electrical lead at predetermined portions of these glass or ceramic bodies so as to secure a reliable bond that will withstand ordinary wear and tear has been a difficult matter. Additionally, it has been difficult to apply a conductive solder which does not migrate and cause short circuiting.

There has been a problem in producing printed conductors which do not migrate on ceramic substrates. A description and study of silver migration is discussed in "Tele-Tech and Electronic Industries," published February 1956. There is a general understanding that printed silver migrates under humid conditions when an electrical potential exists between two closely spaced silver-containing conductors. This has caused silver to be excluded from the fabrication of printed circuits for high reliability equipment. Platinum-gold conductors, because of their complete freedom from migration, have found wide use in electronics industry. These conductors are usually coated with lead-tin solder to raise the electrical conductivity and to serve to attach lead wires on various components. However, the lead-tin solders also undergo migration and consequently cause short circuiting similar to that caused by silver conductor migration.

It is well known that the lead-tin solders migrate nearly as rapidly as the silver in conductors. The conditions which cause silver migration also cause a migration of any other metal that falls in the middle of the electromotive series. The above-described electrical potential (AC or DC) must exist between two adjacent conductors, and a water film capable of carrying ions must bridge the gap between the conductors. Any metal which is readily dissolved at the anodic conductor or easily electrodeposited at the cathodic conductor will migrate. Silver is particularly susceptible since even at low voltages silver dissolves easily and subsequently deposits in needles which quickly bridge a narrow gap. Most common metals that migrate easily include: lead, tin, zinc, copper, indium, and bismuth. Metals which should not migrate because they do not readily electroplate are aluminum and magnesium and other highly electrodeposited materials. Metals which do not migrate because they do not readily dissolve at the anode are gold, platinum, palladium, or those well below hydrogen in the electrochemical series. Therefore, the commonly used lead-tin solder is not a desirable solder in the fabrication of printed circuits for high reliability equipment due to the tendency of lead and tin to migrate.

A common commercial solder which does not migrate is available and can be used where a completely nonmigrating system is desired, but where poor mechanical properties of the solder can be tolerated. This solder, a eutectic gold-tin alloy, melts easily in the usual soldering range of 280° C. and wets platinum-gold or palladium-gold conductors when a common rosin flux is utilized. However, on alumina substrates, the solder bond is so weak and the alloy is so brittle that adhesion values are very low. Therefore, this gold-tin alloy solder can only be utilized where poor mechanical properties can be tolerated.

Thus, the lack of any other good way of mounting components has necessitated the use of available solders despite their tendency to migrate and/or their tendency to produce poor solder bonding. A truly completely nonmigrating system comprising nonmigrating printed conductors and nonmigrating solders has long been needed. More particularly, an urgent need exists for a solder which is resistant to migration and has good mechanical properties (e.g., bonding strength) to permit its use as a solder for printed circuits on alumina substrates.

SUMMARY OF THE INVENTION

This invention relates to nonmigrating, strong bonding solders and printed circuits obtained by their use. The solders of the invention are ternary gold-tin-germanium alloys having melting points not exceeding 325° C. and containing, by weight, 80–85% gold, 5–19% tin, and 1–10% germanium. The printed circuits of this invention comprise conductors, particularly non-migrating, which have been soldered by the above-described solder.

The particular combination of metals in the alloy and the proportions of each metal in the alloy produce solders which do not migrate in printed electrical circuits. These solders have a sufficiently low melting point (not exceeding 325° C.) to be workable under conventional soldering conditions. Additionally, these solders possess good mechanical properties, and in particular, they possess good adhesion properties.

The solders of this invention can be used with printed nonmigrating conductors to produce a substantially nonmigrating system on printed and soldered circuits.

DESCRIPTION OF THE PREFERRED EMBODIMENTS

The ternary gold-tin-germanium alloy contains critical proportions of each metal constituent so that the alloy solder has the desired properties. Gold is the major constituent of the alloy and comprises from 80–85% by weight of the alloy. Gold, being a nonmigrating metal, must constitute at least 80% by weight of the alloy. On the other hand, no more than 85% by weight of gold is used since the presence of larger amounts of gold unduly raises the melting point of the alloy. It is preferred to have an alloy solder which has a melting point near that of eutectic alloy of gold, tin, and germanium. Therefore, the preferred amount of gold is from 81–83% by weight of the alloy.

In order to produce an alloy solder which possesses good solderability properties, from 5–19% by weight of tin is used in the alloy. This amount of tin has been found to provide a workable low melting alloy solder which wets platium-gold conductors, palladium-gold conductors, or other common conductors while maintaining a solder which does not migrate. If there is less than 5% by weight of tin present in the alloy, the melting point is too high. However, when more than 19% by weight of tin is present, the alloy solder becomes too weak and does not possess good bonding properties. The presence of very large amounts of tin also causes the solder to exhibit undesirable migration. A preferred range comprises 9–17% by weight of tin.

The amount of germanium which is present in the alloy solder should range from 1–10% by weight of the alloy. A minor amount of germanium is necessary to provide good bonding strength and adhesion to the substrates. Below 1% by weight of germanium, the alloy does not have the necessary and desired bonding strength. Above 10% by weight of germanium, the melting point of the alloy becomes too high for practical purposes in normal soldering operations. In fact, when temperatures of about 350° C. are necessary to melt the solder, it has been observed that the print on a ceramic substrate chip is dissolved off the substrate. A preferred amount of germanium is from 2–8% by weight of the alloy.

The solder of this invention may be prepared by any one of several conventional methods. It may be desirable to combine all the components beforehand to produce the desired solder composition in a melting pot, usually under a protective atmosphere to prevent undue oxidation of any of the components of the solder. In a preferred method one metal is melted separately, then the second metal is added to this melt, and finally the third metal is added to the melt of the first two metals. In either method, the melt may be cast or otherwise converted to a solid form such as a wire, rod, powder, pellet, sheet, or strip as may be required for the particular application in mind.

The following example is illustrative of the preparation of the solders of this invention. In all of the examples and elsewhere in the specification all parts, ratios, and percentages of materials, ingredients or components are by weight.

Example 1

A gold-tin-germanium solder was prepared by heating 15 grams of tin to 280–300° C. whereby a tin melt was formed. To this melt, 82 grams of gold were added; the gold also melted at this temperature. Then 3 grams of germanium were added to this melt whereby the alloy was formed which contained 82% gold, 15% tin, and 3% germanium. The melting point of the alloy was about 280° C.

The great improvement arising from the use of the above solder of this invention is demonstrated by the following examples. It should be noted that the solder of this invention does not migrate and also possesses good bonding strength.

Example 2

A metalizing composition consisting of 55% gold, 15% platium, 2.25% of a cadmium borosilicate glass frit, 9% bismuth oxide, and 18.75% of a vehicle (8% ethyl cellulose and 92% beta-terpineol) was printed onto an alumina chip (1 inch square) and fired at 950° C. The print was in the form of a conductor having adjacent conductor lines approximately 5 mils apart. This printed conductor was then soldered by immersing it in a lead-tin solder bath which consisted of 90% lead and 10% tin. Two copper wires were also soldered with the lead-tin solder to the external ends of the printed conductors.

A migration test was carried out to determine whether there was any migration of the solder when an electrical potential was applied between the lines of the print as follows: A drop of water was placed over the conductor lines and a three-volt (DC) electrical current was applied through the lead-in copper wires. With a microscope, it was observed that migration of the solder from one conductor line to another took place in six seconds, with consequent short circuiting in the printed conductor also occurring also in the same period of time.

Example 3

A printed conductor was prepared and soldered as described in Example 2. However, the solder used in this example was the gold-tin-germanium solder of this invention as described in Example 1. The migration test was repeated, and it was observed that no migration or short circuiting occurred within one-half hour. This example demonstrates the highly desirable nonmigrating properties of the solder of this invention.

Example 4

A metalizing composition consisting of 55% gold, 15% platinum, 2.25% of a cadmium borosilicate glass frit, 9% bismuth oxide, and 18.75%of a vehicle (8% ethyl cellulose and 92% beta-terpineol) was printed onto an alumina chip (1 inch square) and fired at 950° C. The print was in the form of a solid conductive disc which was ½" in diameter. A 30 mil copper wire was dip soldered onto the disc. The solder contained 90% lead and 10% tin.

A Pull Test was performed on the printed alumina chip as follows: The copper wire was bent to an angle of 90° in relation to the chip. The unattached end of the wire was fastened to a Chatillon Pull Tester which had a scale in pounds. The Pull Tester (having the soldered wire attached thereto) was pulled at the rate of 1½ inches per minute until there was a first indication of the wire pulling apart from the printed alumina chip. A pull of 1.8 pounds pull was required before the wire started pulling apart from the disc on the printed chip.

Example 5

A printed and soldered alumina chip having a copper wire soldered thereto was prepared as described in Example 4. In this example, the solder was a gold-tin solder which contained 80% gold and 20% tin. With this solder, only 0.2 pound were required to start the wire pulling apart from the ceramic chip. The bonding strength of this solder was compared since this solder normally possesses nonmigrating properties.

Example 6

A printed and soldered alumina chip having a copper wire attached thereto was prepared as described in Example 4. The gold-tin-germanium solder of this invention was utilized; it contained 82% gold, 15% tin, and 3% germanium. One pound of pull was required before the wire started pulling apart from the ceramic chip.

The above examples demonstrate the relatively good bonding strength (adhesion) of the solders of this invention. While the solders of this invention do not have the extremely high bonding strength of the migrating lead-tin solders, they do exhibit generally good bonding properties and in this respect are far superior to binary gold-tin solders which are considered to be nonmigrating solders. Thus, the solders of this invention possess the combined properties of nonmigration and generally good bonding strength which combination of properties is not exhibited by any other solders known heretofore.

Solders of this invention can be applied by any conventional methods. For example, wave soldering, immersion or dip soldering, and hand soldering are all methods which may be utilized in applying this solder to substrates and/or wires.

The proportions of each metal constituent must, of course, be selected from previously described proportion ranges. In addition, the melting point of the resulting solder must not exceed 325° C. The upper limit of 325° C. has been set so that no harmful effects or destruction occurs to the printed ceramic chip. Higher temperatures frequently dissolve the print off the ceramic chip. The lowest melting point of the present solders is governed by proportions of each metal constituent within the previously specified proportion ranges of the invention. It is estimated that 270° C. is the lowest inherent melting point that the present solders can possess. However, since all solders which include all possible combinations of proportions have not been evaluated, a specific lower limit melting point cannot be set forth. Therefore, while the lowest melting point of the solders of this invention is not critical, it is inherently specified by the previously described proportion ranges of each metal constituent.

The solders of this invention can be used in the production of printed circuits, particularly noble metal printed circuits, and printed circuit elements or printed circuit components (e.g., described in Example 3). A printed circuit is intended to include any substrate having printed thereon a metalizing composition (e.g., a noble metal, a binder and a vehicle), usually in a conductor pattern. For purposes of this invention, it is not necessary that the printed pattern (i.e., printed conductor lines) be electrically interconnected or have any active or passive electrical devices attached thereto. A noble metal printed circuit includes a substrate having a noble metal printed thereon. A noble metal generally includes: gold, silver, platinum, palladium, rhodium, iridium, alloys, and mixtures thereof.

These solders can be used to attach wires, discs, diodes, transistors, capacitors, and other active and passive electrical devices to ceramic substrates in the formation of printed circuits and printed circuit elements or components. Additionally, these solders can be applied as conductive coatings over printed conductors on ceramic substrates. A most important application of these solders lies in soldering nonmigrating conductor prints (e.g., palladium-gold, platinum-gold prints) on ceramic substrates, although these solders are also useful in soldering migrating conductor prints (e.g., silver-containing prints).

Since it is obvious that many changes and modifications can be made in the above-described details without departing from the nature and spirit of the invention, it is to be understood that the invention is not to be limited to said details except as set forth in the appended claims.

I claim:

1. A solder comprising a ternary gold-tin-germanium alloy having a melting point not exceeding 325° C. and containing 80–85% by weight of gold, 5–19% by weight of tin, and 1–10% by weight of germanium.

2. A solder in accordance with claim 1 wherein the alloy contains 81–83% by weight of gold, 9–17% by weight of tin and 2–8% by weight of germanium.

3. A solder in accordance with claim 1 wherein the alloy contains 82% by weight of gold, 15% by weight of tin, and 3% by weight of germanium.

References Cited

UNITED STATES PATENTS 3,158,471 11/1964 Kadelburg ........... 75—165
3,371,255 2/1968 Belasco et al. ........ 317—234

CHARLES N. LOVELL, Primary Examiner

U.S. Cl. X.R.

29—195, 504